(12) United States Patent
Blaszczak et al.

(10) Patent No.: US 10,586,885 B2
(45) Date of Patent: Mar. 10, 2020

(54) METHOD AND APPARATUS OF FABRICATING AN INTERCONNECTOR ASSEMBLY

(71) Applicant: SOMONT GMBH, Umkirch (DE)

(72) Inventors: Wlodzimierz Blaszczak, Freiburg (DE); Thorstend Hoes, Waldkirch (DE); Daniel Rambach, Teningen (DE); Joachim Ufheil, Wasenweiler (DE)

(73) Assignee: SOMONT GMBH, Umkirch (DE)

( * ) Notice: Subject to any disclaimer, the term of this patent is extended or adjusted under 35 U.S.C. 154(b) by 225 days.

(21) Appl. No.: 15/544,110

(22) PCT Filed: Dec. 18, 2015

(86) PCT No.: PCT/IB2015/059784
§ 371 (c)(1),
(2) Date: Jan. 17, 2018

(87) PCT Pub. No.: WO2016/113616
PCT Pub. Date: Jul. 21, 2016

(65) Prior Publication Data
US 2018/0006184 A1   Jan. 4, 2018

(30) Foreign Application Priority Data

Jan. 16, 2015 (EP) ..................................... 15151553

(51) Int. Cl.
*H01L 31/18* (2006.01)
*H01L 31/05* (2014.01)
(Continued)

(52) U.S. Cl.
CPC ............ *H01L 31/188* (2013.01); *B32B 15/04* (2013.01); *H01L 31/0504* (2013.01);
(Continued)

(58) Field of Classification Search
None
See application file for complete search history.

(56) References Cited

U.S. PATENT DOCUMENTS 4,380,112 A * 4/1983 Little .............. H01L 31/022425
438/64
6,105,651 A   8/2000 Leanna
(Continued)

FOREIGN PATENT DOCUMENTS

EP   2234181 A2   9/2010
EP   2525395 A1   11/2012
(Continued)

*Primary Examiner* — Angel Roman
(74) *Attorney, Agent, or Firm* — Nadya Reingand; Yan Hankin

(57) ABSTRACT

The invention to a method of making an interconnector assembly for electrically interconnecting solar cells, wherein the method comprises: feeding a plurality of (preferably elongated) electrical conductors that form an conductor array defining interspaces that are free from conductors; and applying at least one sheet, preferably made of electrically insulating material, to a side of the conductor array, wherein the sheet has at least one contact zone coming into contact with the conductors and intermediate portions overlapping with the interspaces of the conductor array. The invention also refers to an apparatus for fabricating an interconnector assembly for electrically interconnecting solar cells and to a rotatable heating drum.

20 Claims, 3 Drawing Sheets

(51) Int. Cl.
*H05B 3/00* (2006.01)
*B32B 15/04* (2006.01)

(52) U.S. Cl.
CPC ...... *H01L 31/0516* (2013.01); *H01L 31/1876* (2013.01); *H05B 3/0095* (2013.01); *Y02E 10/50* (2013.01)

(56) References Cited

U.S. PATENT DOCUMENTS

| | | | | |
|---|---|---|---|---|
| 2002/0038663 | A1* | 4/2002 | Zenko | H01L 31/02 136/244 |
| 2005/0241692 | A1* | 11/2005 | Rubin | H01L 31/022425 136/256 |
| 2009/0025788 | A1 | 1/2009 | Rubin et al. | |
| 2012/0294967 | A1* | 11/2012 | Lin | H01L 21/67121 425/174.4 |
| 2013/0277361 | A1* | 10/2013 | Tan | B23K 3/0475 219/616 |
| 2014/0338739 | A1* | 11/2014 | Liu | H01L 31/0516 136/256 |

FOREIGN PATENT DOCUMENTS

| | | |
|---|---|---|
| JP | 2001206798 A | 7/2001 |
| JP | 2003109690 A | 4/2003 |
| WO | 8603623 A1 | 6/1986 |

\* cited by examiner

METHOD AND APPARATUS OF FABRICATING AN INTERCONNECTOR ASSEMBLY

CROSS-REFERENCE TO RELATED APPLICATIONS

The present application is a National stage application from the PCT application PCT/IB2015/059784 filed on Dec. 18, 2015 which claims priority to European application 15151553.3 filed on Jan. 16, 2015.

FIELD OF INVENTION

The invention refers to a method of making/fabricating an interconnector assembly for electrically interconnecting solar cells, wherein the method comprises: feeding a plurality of (preferably elongated) electrical conductors that form an conductor array defining interspaces that are free from conductors; and applying at least one sheet, preferably made of electrically insulating material, to a side of the conductor array, wherein the sheet has at least one contact zone coming into contact with the conductors and intermediate portions overlapping with the interspaces of the conductor array. The invention also refers to an apparatus for fabricating an interconnector assembly for electrically interconnecting solar cells and to a rotatable heating drum.

BACKGROUND

US 2009/0025788 A1 discloses a device for producing a film-type adhesive optically transparent electrode. Parallel lines of wires are disposed on a polymeric film, which is supplied from a drum. The surface of the film facing the wires is coated with a transparent adhesive. The film is lead by the drum over the surface of a rotatable roller and is pulled by a further drum, simultaneously pulling the wires. The wires are pressed on the film by means of another roller arranged above the rotatable roller. Simultaneously, the film is heated by the rollers, so that the adhesive softens. The wires immerse in the adhesive and, after cooling down, remain fixed to the film and embedded in the adhesive. During heating the film by means of the pair of rollers the film becomes sticky and there is the risk of adhering to the rollers causing damage of the film and contaminating the fabrication device.

JP2003 109690 A discloses a method for manufacturing an anisotropic conductor from a heat-adhesive polymer film and conductive wires. Heating the film causes that the film becomes sticky and adheres to machine parts.

EP 2525395 A1 discloses a machine for manufacturing an electrode tape. The machine comprises a conveyor, a conductive coil structure, an adhesive material supply unit and a curing unit adapted to cure the adhesive material.

EP 2234181 A2 relates to a manufacture method for photovoltaic module. A plurality of strips of resin adhesive film having a desired width and unwound from a single feed reel may be simultaneously pasted on a solar cell. Each of the plural solar cells is electrically connected to its adjoining solar cell by means of wiring material. The wiring material is placed on each strip of conductive adhesive film pasted on the front and back sides of the solar cell. Heater blocks are used to press down each wiring material against the solar cell. Such a solution has the risk of damaging the solar cell by the heating blocks.

JP2001 206798 A discloses—in a completely different technical field—a silicon ribbon production device comprising a rotary cooling body brought into contact with a silicon melt.

U.S. Pat. No. 6,105,651 A discloses—also in a completely different technical field—a rotary hot foil stamping system. A cylinder assembly is used for transferring foil onto a substrate and comprises a plurality of magnets, a die plate and a heating structure.

WO 86/03623 A1 discloses a method for electrically interconnecting a plurality of solar cells in series using a multi-faced drum.

From US2011197947A1 an interconnector is known for interconnecting solar cells that basically consists of a plurality of parallel wires and a first and a second foil applied to opposite sides of that plurality of parallel wires.

DE10130005A1 relates to a different technical field and discloses laminating metals bands with polymers by heating the metal band above the melting point of the polymer and ensuring that after pressing the metal and the polymer together the temperature of the surface of the polymer contacting the metal band is higher than its melting temperature, while the temperature of the surface of the polymer facing away from the metal band is lower than its melting temperature.

SUMMARY

The problem in the fabrication of solar cell interconnectors that are assembled from a plurality of electrical conductors and a sheet (usually made from electrically insulating material) consists in the fact that the conductors forming the conductor array should be reliably bounded to the sheet. It is necessary to heat the sheet such that it becomes sticky. However, this may cause severe problems, since the sticky areas may also adhere on parts of the fabrication apparatus, such as rolls, pressing means, supports, etc., causing damage of the sheet and contaminating the fabrication apparatus. The quality of the resulting interconnector assemblies becomes negatively affected. The deformability of the sheet, when its material is melting, causes distortions of the interconnector assembly since the conductor array as such has no form stability. The implication are costly (minor quality) and time-consuming (cleaning, service).

The object of the invention is to overcome these problems and to provide a reliable solution for fabricating interconnector assemblies that does not have a negative impact on the fabrication apparatus and yields high quality interconnectors.

This object is achieved with a method as mentioned at the beginning wherein the step of applying the at least one sheet to a side of the conductor array comprises:

before the conductors come into in contact with the sheet and/or when the conductors are in contact with the sheet: increasing the temperature in the at least one contact zone of the sheet to a first temperature, wherein the first temperature is above the temperature at which the material forming that contact zone becomes sticky, such that the conductors are bonded to the sheet (when brought into contact therewith), wherein (at the same time) the side of the sheet that faces away from the conductor array is kept at a second temperature, wherein the second temperature is below the temperature at which the material forming the side of the sheet that faces away from the conductor array becomes sticky, and/or wherein (at the same time) the intermediate portions of the sheet at least partially are kept at a second temperature, wherein the second temperature is below the temperature at which the material forming the intermediate portions becomes sticky.

'Keeping at a second temperature' may be achieved e.g. by a dosed heat transfer from the heating means and/or by a structured heating means causing a spatially non-uniform heat transfer and/or by a short heating period or short heating pulse(s) such that the heat cannot uniformly spread through and/or along the sheet. In the latter case the heating pulses are preferably shorter than the thermal relaxation time of the sheet material.

'Becoming sticky' means that the material becomes adhesive, such that the wires that come into contact with that sticky material (durably) adhere on the sheet when the material subsequently cools down. Preferably, 'becoming sticky' means that the material is—at least partially—brought into a molten or semiliquid state.

Preferably, the first temperature is the melting temperature or the lowest temperature of the melting range of the material forming that contact zone. Usually, polymers and/or plastic sheets do not have a sharp melting point but a melting range that is due to e.g. different polymers chain lengths and/or different types of bonding. The melting temperature and/or melting range may be e.g. determined according to EN ISO 3146: 2002-06—"Plastics—Determination of melting behaviour (melting temperature or melting range) of semi-crystalline polymers by capillary tube and polarizing-microscope methods" and/or according to DIN EN ISO 11357-3 "Plastics—Differential scanning calorimetry (DSC)—Part 3: Determination of temperature and enthalpy of melting and crystallization". The melting range is the temperature range over which crystalline or semi-crystalline polymers lose their crystalline characteristics or particulate shape when heated. The 'lowest temperature of the melting range' (or "lower limit of the melting range") is that temperature at which the melting process starts.

Alternatively, the melting temperature or melting range may be e.g. also determined according to ASTM D3418—"Standard Test Method for Transition Temperatures and Enthalpies of Fusion and Crystallization of Polymers by Differential Scanning calorimetry".

The second temperature is a temperature below the melting temperature or melting range of the respective material (side facing away from the conductor array and/or intermediate portions).

Preferably, the difference between the first temperature and the second temperature amounts to at least 10° C., preferably at least 20° C.

An advantage of the invention can be seen in the fact that only that side or areas of the sheet coming into contact with the conductors is/are heated above the first temperature. The sticky properties of the sheet material caused by heating above the first temperature occur only in a spatially clearly defined area (on one side of the sheet and/or in the contact zones). All other portions of the sheet may be kept at a second temperature that may be below the first temperature. Adverse effects such as adhering to components of the fabrication device damage of the sheet may be effectively avoided. At the same time the contacting zones become sticky and result in a reliable bonding of the conductors to the sheet.

Sheets or foils formed by a carrier layer and a coating exhibit the so-called bimetall effect (warping due to temperature differences). In order to counter-act this effect it is preferred to not (pre-)heat the full area of the sheet.

While the contact zones have a temperature above the first temperature (i.e. become sticky) when the wires are (or come) in contact with the sheet, the side of the sheet facing away from the conductor array and/or the intermediate regions during the whole fabricating method do not reach a temperature at which their respective materials becomes sticky.

Before the conductor array comes in contact with a sheet it is preferably in a free or loose state, i.e. the conductor array is fed as such and is not connected to other parts/components of the (future) interconnector assembly or solar cell module. I.e. the interconnector assembly is fabricated prior to assembling the solar cell module by electrically connecting the solar cells with each other by means of the conductors of the interconnector assembly.

The step of feeding a plurality of (preferably elongated) electrical conductors that form an conductor array is preferably performed by a transporting means that transports the conductor array—together with or separate from the sheet(s)—to a heating means for increasing temperature at least of the contact zone(s).

The method is performed in an fabrication apparatus. The apparatus comprises a transporting means for transporting the conductor array and/or the sheet. The transporting means defines a transporting path and a transporting direction and may e.g. comprise at least one roller and/or at least one circulating belt.

A conductor array may be any arrangement of electrical conductors, such as an array of essentially parallel wires, a mesh formed by conductors, a grid, or a network. Also mesh-, web- or grid-like structures or any other suitable form would be possible. A mesh may for example be made by "woven" or intertwining wires or by other technologies for example such as disclosed in U.S. Pat. No. 8,569,096 B1. The electrical conductors may for example be wires, strips or ribbons.

It would be also possible that the complete conductor array, e.g. grid or web, are made of a single piece of material, cross-connections between the elongated conductors also being integral part of that piece of material (see for example U.S. Pat. No. 8,569,096 B1). The plurality of conductors would then form a single-pieced conductor array.

The contact zone(s) of the sheet is/are that portion(s) that come directly in contact with the conductors, i.e. that touch the conductors. In the case of connected conductors (e.g. in form of a mesh, grid or network) or a one-pieced conductor array there is only one "continuous" contacting zone, wherein the intermediate portions are "islands" bordered (or enclosed) by contacting zone sections. In the case of an array of single conductors (i.e. not connected with each other, e.g. parallel extending wires) there are several contact zones distanced from each other.

An interconnector assembly may be also called an electrode and serves to interconnect solar cells in a solar cell module and to transport electrical current from one cell to the next and finally out of the module.

The sheet(s) that is/are applied to the conductor array is/are preferably made of electrically insulating material. The sheet(s) may be a foil or a web or a spunbond, preferably made of a polymer.

The sheet should prevent encapsulant material to penetrate between the wires and the cells during fabrication (lamination) of the solar cell module, while itself adhering to the cells after lamination. In addition, the sheet may facilitate the handling of the interconnector assembly, meaning that it gives the interconnector assembly a certain amount of stiffness and holds the conductors so that the interconnector assembly can be processed more easily, preferably fully automatically.

The sheet of material that later covers the "sunny side" (side facing the sun in usage) of the solar cell should be transparent for the appropriate wavelengths (holes providing ultimate transparency), so that light can reach the cell.

The sheet(s) can for example be made of Low-density polyethylene, possibly with EVA content, Polyolefin, Ionomer, Polyethylene terephthalate, PMMA (Poly(methyl methacrylate)) or ETFE (Ethylene tetrafluoroethylene). Normally, such transparent materials are non-conductive, but any amount of conductivity (for example a conductive transparent layer) could contribute to a lower series resistance between the cells and therefore would be beneficial as long as it is transparent enough or only extends on the back side. The first and second sheet of material may be made of or comprise the same or different materials. For example the sheet in the module not covering the sunny side of the solar cell may be of an opaque (conductive) material or of a white or reflective material reflecting light. It may even comprise a metal sheet such as an aluminum foil. For bi-facial cells it is more likely to use transparent sheet on both sides of the cell, that each may be adapted to its function. The sheet on the side normally not facing the sun may e.g. be less UV resistant than the foil facing the sun at noon.

Preferably, the electrical conductors of the conductor array are heated to a degree that they can heat-up the contact zone (when coming into contact with the contact zone) to a temperature making the contact zone sticky. This may be done by means of a heating drum and/or an IR-source.

Preferably the temperature of the ambient atmosphere is raised so that the temperature of the sheets is raised above 40° C., even more preferably above 60° C.

Preferably, the step of applying the at least one sheet to a side of the conductor array comprises: guiding the conductor array and the at least one sheet in an overlapping manner by means of a supporting surface of a heating means in a transporting direction, wherein preferably the heating means is formed by a rotatable heating drum. The supporting surface of the heating means allows to heat the sheet from one side, i.e. causing a non-uniform heat distribution within the sheet in a direction perpendicular to the sheet (plane). The transport of the sheet and the conductor array along the supporting surface allows to reduce the effective heating period of a certain sheet portion. The transport velocity may be adjusted in order to keep the temperature of the side of the sheet facing away from the conductors (and away from the supporting surface of the heating means) below its melting temperature or melting range.

Preferably, the conductor array and the at least one sheet overlapping with each other are heated only from the side of the conductor array. In this way a temperature gradient may be achieved. In this embodiment there is no heating from the side facing away from the conductor array.

Preferably, the at least one sheet is fed from an endless sheet reservoir (preferably a reservoir drum) and/or the conductors are fed from an endless conductor reservoir (preferably from a reservoir drum).

Preferably, the heating means has a structure of at least one first portion and at least one second portion, preferably a plurality of first and second portions, wherein the first portion(s) and the second portion(s) alternate with each other in a direction that is parallel to the supporting surface of the heating means and perpendicular to the transporting direction of the conductor array and/or the sheet and wherein the first portion(s) has/have a higher heat-conducting rate and/or a higher heat-generating rate than the second portion(s). This allows in an elegant way to induce a non-uniform heat distribution in the sheet in a direction parallel to the sheet (and perpendicular to the transporting direction).

Preferably, the first portions of the heating means come into contact with the conductors and/or the contact zones of the sheet, when guided along the supporting surface of the heating means. Preferably, at the same time the second portions of the heating means overlap with the intermediate portions of the sheet.

The first portions may ensure a low thermal resistance between the inside of the heating means (drum) and corresponding areas of the supporting surface. Alternatively or additionally, the first portions may have more material that can be heated by induction as compared to the second portions. The second portions ensure that the thermal resistance in the areas of the second portions is higher than that in the areas of the first portions.

Preferably, the heating means and/or the conductor array is heated by means of an inductive element, particularly a coil, winding(s) or loop(s). This allows to selectively heat electrically conductive materials, wherein electrically insulating materials are not (directly) heated by the inductive element. The inductive element may thus be used to induce a non-uniform heat distribution within the sheet.

If the width of the at least one sheet and/or conductor array is wide, it is beneficial to use two inductive elements that are connected in parallel. In this way the resonance frequency can be higher.

Preferably, the inductive element uses resonance frequencies of 500-1200 kHz, preferably 800-1000 kHz.

Preferably, the heating means (e.g. drum) comprises paramagnetic material, wherein preferably the first portion(s) is/are formed from a paramagnetic material (such as paramagnetic high-grade steel). The second portion(s) may be formed from non-magnetic material and/or electrically insulating material. In this way the first portions concentrate the field lines of the inductive element just where the wires pass. Also, field lines are drawn away from the second portions and portions of the heating means adjacent thereto, keeping the second portions cooler.

Preferably, a sheet abuts (during its transport along the heating means) against the supporting surface of the heating means with its side that faces away from the conductor array. The side facing away from the conductor array is held below its melting temperature or melting range. Adhering of the sheet on the supporting surface is prevented.

Alternatively, the conductor array and the side of the sheet being in contact with the conductor array abuts against the supporting surface of the heating means. Adhering may be effectively prevented, when the intermediate portions are kept below their melting temperature or melting range. Only the contacting zones, which however are covered by the conductors are brought above their melting temperature or at least above the lowest temperature of their melting range.

Preferably, the conductor array and the sheet are pressed against the supporting surface of the heating means, preferably by a circulating belt, and/or by a tensioning means for tensioning the conductor array. In such a way a good thermal contact is established between sheet and supporting surface.

Preferably, the conductor array is formed by wires running mainly in the same direction, preferably running in parallel, that preferably are distanced from each other.

Preferably, at least two sheets, one or each preferably made of electrically insulating material are applied to the conductor array, wherein a first sheet is applied to a first side of the conductor array and a second sheet is applied to a second side of the conductor array opposing the first side.

The sheets may overlap in direction of the transporting direction along the transporting path.

Preferably, the sheets are applied to the conductor array such, that the first sheet and the second sheet at most partially overlap in a direction the plurality of (elongated) conductors extends in. Preferably the first sheet and second sheet do not overlap, preferably a gap is left between them in a direction the plurality of elongated electrical conductors extends in.

It is preferred that the sheet is not applied to the conductor array as a continuous foil on one side of the conductor array, but as individual sheets on both sides. Since the sheets are placed alternatingly on both sides of one and the same conductor array, the interconnector assembly is automatically suited for being connected to the upper and the lower side of two (neighbouring) solar cells to be interconnected to form a solar cell module. Moreover, since the conductor array can be made to extend continuously over a large number of first and second sheets of material, the interconnectors only need to be cut out of the "string" of interconnector assembly to be ready for use. Since the plurality of wires extends in continuous fashion from the first to the second sheet of material, and therefore later from one cell to the next, the interconnector assembly becomes easier to manufacture while eliminating contact resistance between the component parts of the interconnector, thus reducing power losses, and more robust and less error-prone.

An embodiment of the method according to the invention comprises the step of "increasing the temperature in the at least one contact zone of the sheet above the first temperature at which the material forming that contact zone becomes sticky" comprises:

pre-heating (or keeping until the conductors are applied) the contact zones of the sheet or the complete sheet to (or at) a temperature T, wherein the temperature T is $20°\,C.<T<T_m$ ($T_m$=melting temperature or lowest temperature of the melting range of the sheet material in Degrees Celsius), preferably $T_m/2<T<T_m$, more preferred $0{,}8\,T_m<T<T_m$;

and subsequently locally heating the sheet to a temperature $T>T_m$.

The last step may be done by elevating the temperature of the conductors, preferably to a temperature $T>T_m$.

Optionally, the sheet and the conductor array are pressed together.

As already mentioned it is preferred that the contact zones (i.e. the future adhering portions) of the sheet (later) touching the wires are heated to (and preferably kept) a temperature $T>T_m$, while ensuring that intermediate portions of the sheet (later) not touching the conductors remain at $T<T_m$ (e.g. by selectively not heating or and/cooling them).

The object of the invention is also achieved with an apparatus for fabricating an interconnector assembly for electrically interconnecting solar cells, characterized by:

means for bringing together a plurality of (preferably elongated) electrical conductors that form an conductor array and a sheet, preferably made of electrically insulating material, heating means adapted for inducing a non-uniform heat distribution within the sheet, wherein preferably the heating means is moveable, and a transporting path for transporting the conductor array and/or the sheet, wherein the transporting path at least partially extends along the heating means.

The means for bringing together a plurality of (preferably elongated) electrical conductors that form an conductor array and a sheet may comprise at least one transporting means feeding the sheet and conductor array towards the heating means, preferably from different directions. The fabrication apparatus is adapted to perform the method according to the invention and its embodiments.

As already mentioned, the transporting path is defined by the transporting means, e.g. roller(s), belt(s), etc., The transporting path extends from a sheet storage and/or conductor array storage towards the heating means and from the heating means towards the output of the fabrication apparatus.

Preferably, the non-uniform heat distribution results in first sheet portions (e.g. side contacting the conductors) that have a temperature above the first temperature (material becomes sticky) and second sheet portions (e.g. side facing away from the conductor array and/or intermediate portions) that have a second temperature below the first temperature. Preferably, the temperature differences between the first sheet portions and the second sheet portions amounts to 5%, preferably 10%, more preferred 20% of the first temperature (related to the Celsius scale).

Preferably, the non-uniform heat distribution extends in a direction perpendicular to the sheet (plane) and/or parallel to sheet (corresponding with the run/position of conductors).

Preferably, the heating means has a supporting surface for receiving the conductor array and/or the sheet and defining a transporting path section that extends along the supporting surface of the heating means, wherein the heating means has a structure of at least one first portion and at least one second portion, preferably a plurality of first and second portions, wherein the first portion(s) and the second portion(s) alternate with each other in a direction that is parallel to the supporting surface of the heating means and perpendicular to the transporting direction along the transporting path section and wherein the first portion(s) has/have a higher heat-conducting rate and/or a higher heat-generating rate than the second portion(s). The first and second portions cause a non-uniform temperature distribution on the supporting surface. The sheet is then exposed to this non-uniform temperature distribution.

Preferably, the heating means is formed by a rotatable drum, wherein preferably the drum having an inlet for heating fluid. The rotatable drum has the advantage that is reliably guides or transports the sheet and/or the conductor array. The cylindrical surface of the drum coming into contact with the sheet is preferably smooth (i.e. does not have steps).

In an alternative embodiment the heating means may be formed by a plate, preferably having a curved supporting surface (the plate having first and second portions as disclosed above). In a further embodiment the heating means may comprise a (circulating) belt, wherein the belt surface acts as supporting surface and wherein the first and second portions are formed within the belt.

Due to the first and second portions of the drum the cylindrical surface of the drum has a non-uniform temperature distribution in a direction parallel to the axis of the drum. In the case heating fluid is used heat is transported from a cavity provided within the drum to the mantle of the drum. Additional heat in the surface area of the drum may be also generated by an induction element.

Preferably, the first portion(s) and the second portion(s) form the supporting surface or extend close to the supporting surface.

Preferably, the first portion(s) is/are formed from electrically conducting material (preferably metal) and the second portion(s) is/are formed from electrically insulating material (preferably plastic). Besides the fact that electrically conducting material is usually also a good thermal conductor, it allows the possibility to be (additionally) heated by electromagnetic induction.

Preferably the apparatus comprises at least one induction element, particularly a coil, winding(s) or loop(s), and wherein the first portion(s) is/are arranged in the effective range of the at least one induction element, wherein preferably the transporting path extends between the induction element and the supporting surface of the heating means.

Preferably, the melting temperature or the lowest temperature of the melting range of the material of the contact zone(s) of the sheet is lower than the melting temperature or the lowest temperature of the melting range of the material forming the side of the sheet that faces away from the conductor array. This effectively prevents the side facing away from the conductor array from becoming sticky or molten.

Preferably, the heating means forms a cavity for receiving a heating medium and wherein preferably the first portion(s) extend(s) into the cavity or close to the cavity. The heat of the heating medium is transported by the first portions much more effective than by the second portions.

Preferably, the apparatus comprises a means for pressing the conductor array and the sheet against the supporting surface of the heating means, wherein preferably the means for pressing is formed by a circulating belt and/or by a tensioning means for tensioning the conductor array.

Preferably, the means for pressing is transparent to infrared radiation, and wherein preferably a process temperature, particularly the temperature of the sheet and/or the conductors and/or the heating means, is monitored by means of a pyrometer.

Preferably, the circulating belt is transparent to infrared radiation so that the process temperature (temperatures of the materials and/or the drum) can be monitored by observing the infrared radiation. The circulating belt may be e.g. a Teflon belt.

Preferably, the process temperature(s) is/are monitored using a pyrometer.

Preferably, the conductor array, especially when containing wires, is tensioned prior to the sheet(s) being applied to the conductor array, e.g. with tensioning means, such as a roller or a pair of rollers. Since the conductor array is heated, it expands making it longer than the sheet it is applied to. Even after having cooled down they remain elongated. If the conductor array is pre-tensioned, they return to the desired length as the tension is released.

The object of the invention is also solved with a heating drum having a (cylindrical) supporting surface for receiving a plurality of electrical conductors that form a conductor array and/or a sheet, wherein the heating drum has a structure of at least one first portion and at least one second portion, preferably a plurality of first and second portions, wherein the first portion(s) and the second portion(s) alternate with each other in a direction parallel to the axis of the drum and wherein the first portion(s) has/have a higher heat-conducting rate and/or a higher heat-generating rate than the second portion(s). The supporting surface is formed by the cylindrical surface of the drum. The heating drum may be used for making an interconnector assembly for electrically interconnecting solar cells, particularly for applying at least one sheet (preferably made of electrically insulating material) to a side of a conductor array. Preferably, the heating drum is used as heating means in an inventive method.

Preferably, the first portion(s) and/or second portion(s) of the structure are essentially rotational-symmetric with respect to the axis of the drum.

Preferably, the heating drum forms a cavity for receiving a heating medium and wherein preferably the first portion(s) extend(s) into the cavity or close to the cavity.

Preferably, the drum has an inlet for introducing heating fluid, and preferably also an output for discharging the heating fluid. Alternatively, the heating fluid (that may also be a gas, e.g. air) can be heated inside the drum, e.g. by means of an electrical heater or the drum can be heated directly.

Preferably, the first portion(s) and the second portion(s) form the supporting surface or extend close to the supporting surface.

Preferably, the first portion(s) is/are formed from electrically conducting material and the second portion(s) is/are formed from electrically insulating material.

Preferably, the heating drum comprises at least one induction element, particularly a coil, winding(s) or loop(s), and wherein the first portion(s) is/are arranged in the effective range of the at least one induction element.

Preferably the heating means is formed from a number of rings held together e.g. by bolds, the rings thus forming a drum-like structure. In this way rings (e.g. made from metal) forming the first portions may alternate with rings (e.g. made from plastic) forming the second portions. It is easier to make such rings and then join them than to make a complete heating drum.

BRIEF DESCRIPTION OF DRAWINGS

Further embodiments of the invention are indicated in the figures and in the dependent claims. The list of reference marks forms part of the disclosure. The invention will now be explained in detail by the drawings. In the drawings:

DETAILED DESCRIPTION OF THE PREFERRED EMBODIMENT

The present invention will be described with reference to exemplary embodiments and the present invention is not limited to particular interconnectors, devices, use or methods, except as defined in the appended claims. Embodiments of the present invention may be used with a variety of methods and systems. It will be apparent to one skilled in the art that the present invention may be practiced in a variety of ways within the scope of the claims. All features shown in relation to the figures may be applied mutatis mutandis to the invention as described in the claims and the claim description.

As used herein, the indefinite article ("a", "an") denotes the presence of at least one of the referenced item, and the term 'a plurality' or 'multiple' denotes the presence of more than one.

In the figures only parts essential for the current invention are shown schematically, for better understanding the invention.

Figure 2:
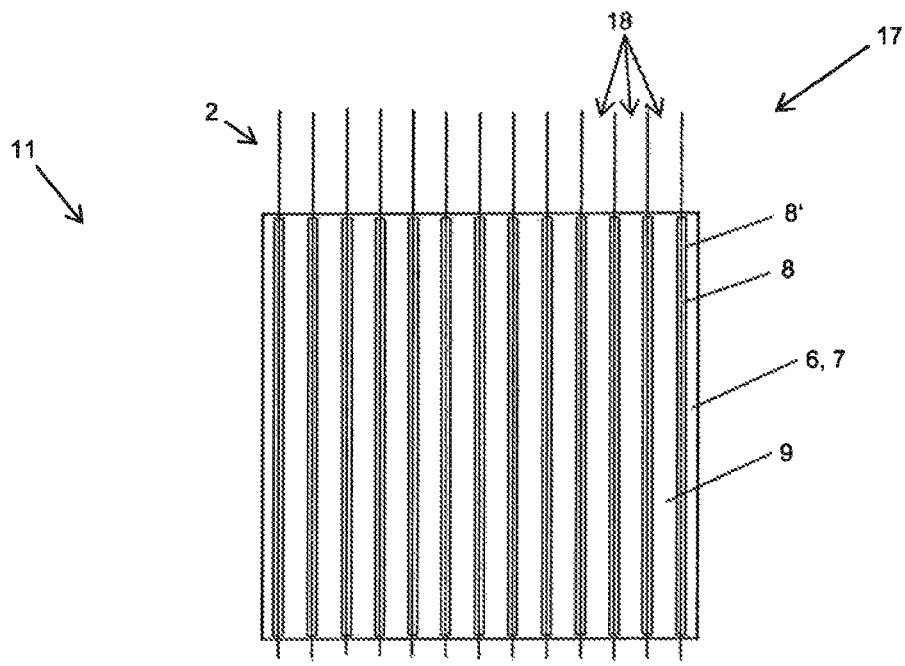
FIG. 2 shows an interconnector assembly built from a plurality of conductors and a sheet.
Figure 5:
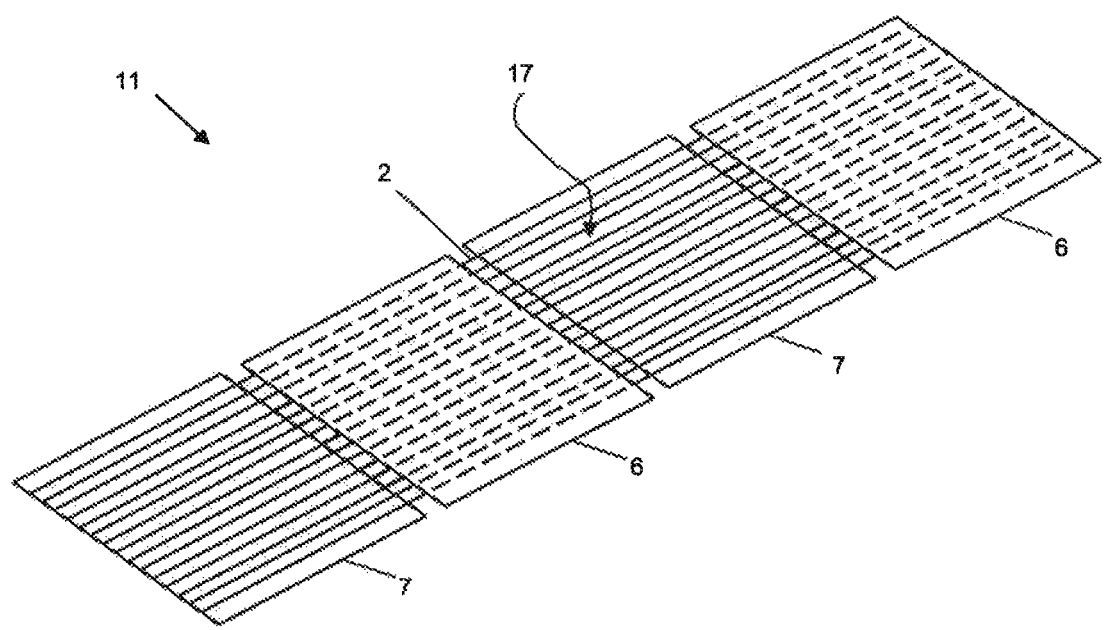
FIG. 5 shows an embodiment of an interconnector assembly.
Figure 6:
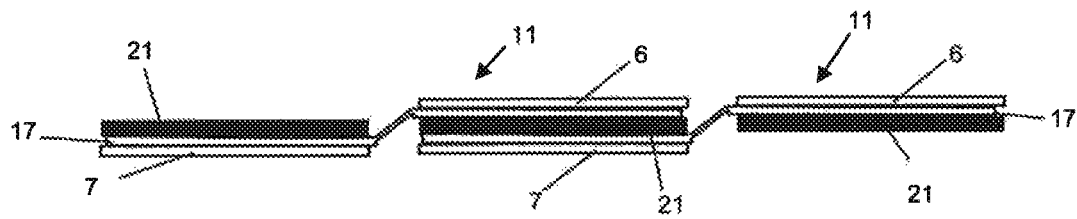
FIG. 6 shows the use of an interconnector assembly when electrically connecting solar cells.

At the beginning of the figure description possible structures of interconnector assemblies are discussed with respect to the FIGS. 2, 5 and 6. FIG. 2 shows an interconnector assembly 11 build up from a conductor array 17 of elongated electrical conductors 2 and a sheet 6 (or 7). The conductor array 17 defines interspaces 18 that are free from conductors 2. The sheet has contact zones 8 being in direct contact with the conductors 2 (i.e. covered by the conductors 2). The sheet has intermediate portions 9 extending between the contact zones 8 and overlapping with the interspaces 18 of the conductor array 17. Portions 8' denote portions directly adjacent to the contact zones 8.

FIG. 5 shows an embodiment of an interconnector assembly 17 for solar cells 21 (FIG. 6). It comprises of first sheets 6 and second sheets 7 both applied (also called attached) to a conductor array 17. The conductor array 17 extends between and over the sheets 6, 7.

As shown, the first sheets 6 are placed on the top side of the conductor array 17, i.e. applied to the upper side of the conductor array 17. The second sheets 7 are placed on the lower side of the conductor array 17, i.e. applied to the lower side of the conductor array 17. Even though typically both sheets are made of a transparent or semi-transparent material, the portions of the conductors 2 extending under the first sheet 6 are shown with a dashed line for clarity. An interconnector assembly as shown in FIG. 5 may also be called an interconnector string. From that string two interconnectors may be cut.

FIG. 6 shows two interconnector assemblies 11 interconnecting three solar cells 21. The portion of the conductors extending between two sheets 6, 7 is bent. The bend mainly has the shape of a sigmoid function. The solar cells 21 are thus aligned in one plane.

The interconnector assembly can, however, have any other structure and shape.

In the following, the method of making an interconnector assembly 11 for electrically interconnecting solar cells 21 is described in more detail.

The method comprises comprises the steps of:

feeding a plurality of elongated electrical conductors 2 that form an conductor array 17 defining interspaces 18 that are free from conductors 2, and applying at least one sheet 6, 7, preferably made of electrically insulating material, to a side of the conductor array 17, wherein the sheet 6, 7 has at least one contact zone 8 coming into contact with the conductors 2 and intermediate portions 9 overlapping with the interspaces 18 of the conductor array 17.

The step of applying the at least one sheet 6, 7 to a side of the conductor array 17 comprises:

before the conductors 2 come into in contact with the sheet 6, 7 and/or when the conductors 2 are in contact with the sheet 6, 7: increasing the temperature in the at least one contact zone 8 of the sheet 6, 7 to a first temperature, wherein the first temperature is above the temperature at which the material forming that contact zone 8 becomes sticky, such that the conductors 2 are bonded to the sheet 6, 7 by the sticky material of the contact zone (when in contact with the conductors 2).

Figure 7:
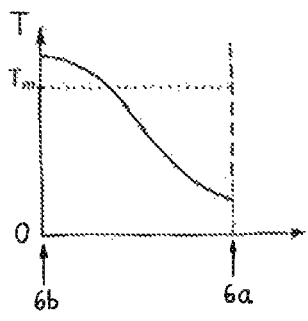
FIG. 7 shows the temperature distribution within the sheet in a direction perpendicular to the sheet plan.

In one preferred embodiment the side 6a, 7a of the sheet 6, 7 that faces away from the conductor array 17 is kept at a second temperature, wherein the second temperature is below the temperature at which the material forming the side 6a, 7a of the sheet 6, 7 that faces away from the conductor array 17 becomes sticky. This is shown in FIG. 7. While the side 6b coming into contact with the conductors 2 is heated above the melting temperature (or lowest temperature of the melting range) $T_m$ the side 6a facing away from the conductor array 17—at the same time—remains below $T_m$.

Figure 8:
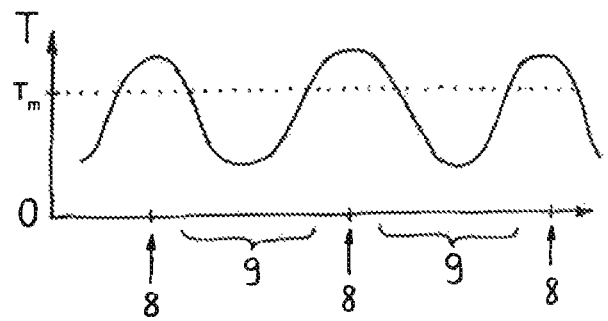
FIG. 8 shows the temperature distribution within the sheet in a direction parallel to the sheet plan.

In an alternative (or additional) embodiment the intermediate portions 9 of the sheet 6, 7 at least partially are kept at a second temperature, wherein the second temperature is below the temperature at which the material forming the intermediate portions 9 becomes sticky. This is shown in FIG. 8 (the x-axis representing the location on the sheet 6, 7 measured perpendicularly to the direction the contact zones 8 extend in). While the contact zones 8 coming into contact with the conductors 2 are heated above the melting temperature (or lowest temperature of the melting range) $T_m$ the intermediate portions 9 at least partially remains below $T_m$—at the same time.

Figure 1:
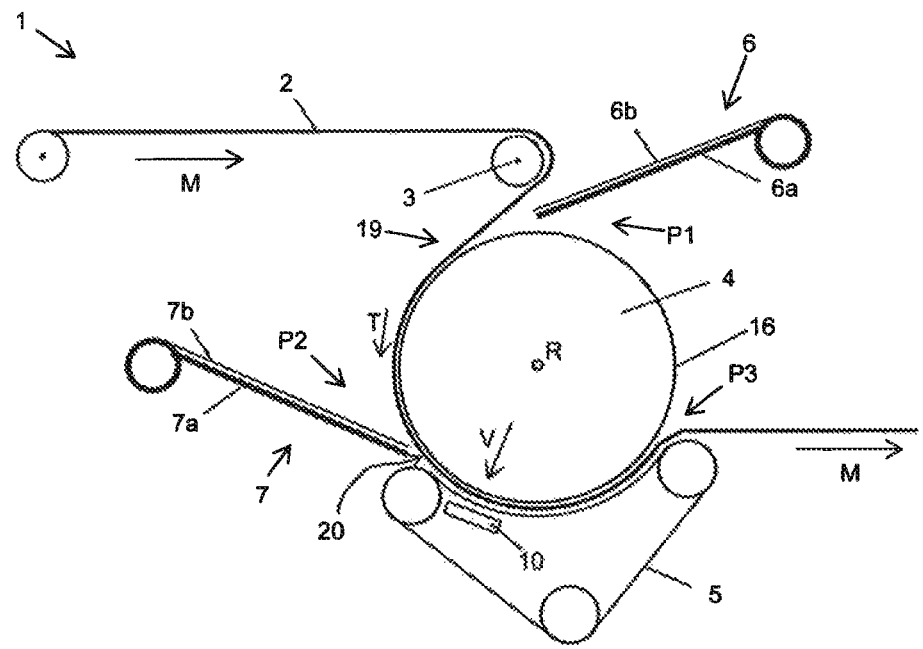
FIG. 1 shows an apparatus for fabricating an interconnector assembly.

As can be seen from FIG. 1 the step of applying the at least one sheet 6, 7 to a side of the conductor array 17 comprises: guiding the conductor array 17 and the at least one sheet 6, 7 in an overlapping manner by means of a supporting surface 16 of a heating means 4 in a transporting direction T. In the embodiment of FIG. 1 the heating means 4 is formed by a rotatable heating drum. However, the heating means may be also formed as (transporting) belt.

Figure 3:
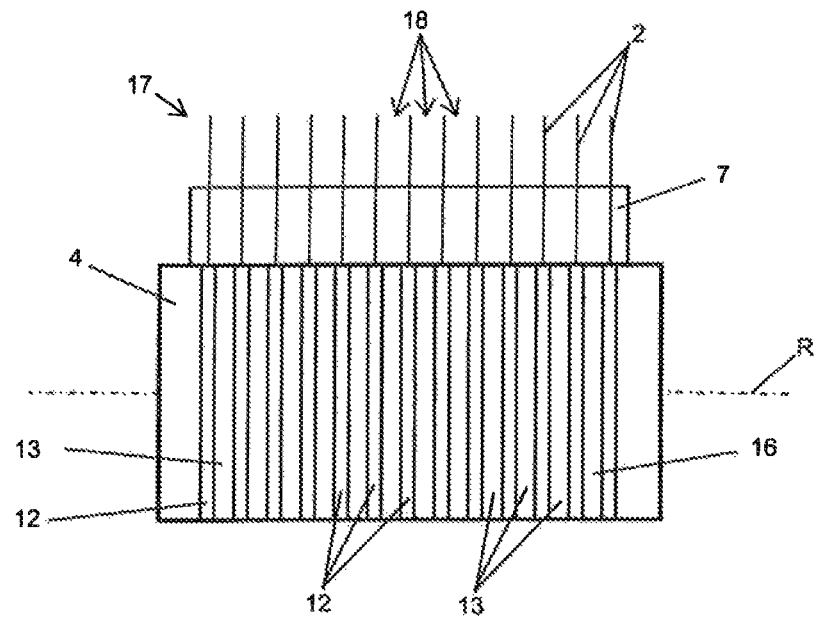
FIG. 3 a structured heating means in form of a drum.
Figure 4:
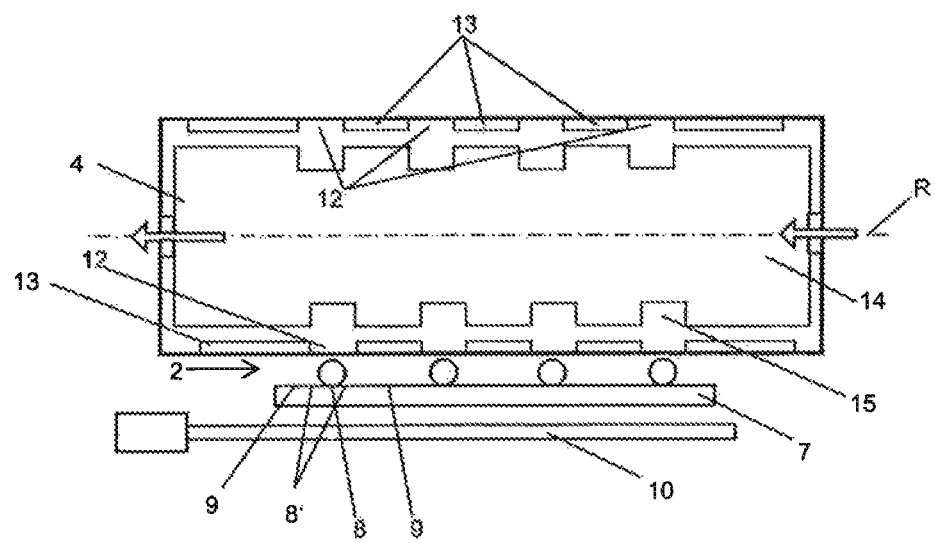
FIG. 4 shows the drum of FIG. 3 in sectional view.

As can be seen from FIGS. 3 and 4, the heating means 4 may have a structure of at least one first portion 12 and at least one second portion 13 (here: a plurality of first and second portions 12, 13), wherein the first portion(s) and the second portion(s) alternate with each other in a direction that is parallel to the supporting surface 16 of the heating means 4 and perpendicular to the transporting direction T of the conductor array 17 and/or the sheet 6, 7. The first portion(s) 12 has/have a higher heat-conducting rate (thermal conductivity) and/or a higher heat-generating rate (capability of generating heat, e.g. upon being exited by electromagnetic induction) than the second portion(s) 13. The first portions may be also heated by a structured electrical resistance heater.

The heating means 4 and/or the conductor array 17 is heated by means of an inductive element 10, particularly a coil, winding(s) or loop(s).

As can be seen from FIG. 1 a first sheet 6 abuts against the supporting surface 16 of the heating means 4 with its side 6a facing away from the conductor array 17. A second sheet 7 is fed towards the other side of the conductor array 17.

The apparatus 1 for fabricating an interconnector assembly 11 for electrically interconnecting solar cells 19 as shown in FIG. 1 thus has:

means for bringing together a plurality of electrical conductors 2 and sheets 6, 7 (here: in form of converging feeding paths realized by (deviation) roller(s) and by the heating drum)

heating means 4 adapted for inducing a non-uniform heat distribution within the sheet 6, 7, wherein preferably the heating means (4) is moveable (here: rotatable), and a transporting path 19 for transporting the conductor array 17 and/or the sheet 6, 7, wherein the transporting path 19 at least partially extends along the heating means 4.

The heating means 4 has a supporting surface 16 for receiving the conductor array 17 and/or the sheet 6, 7. The supporting surface 16 defines a transporting path section 20 of the sheet 6, 7 that extends along the supporting surface 16 of the heating means 4. The first portion(s) 12 and the second portion(s) 13 alternate with each other in a direction that is parallel to the supporting surface 16 of the heating means 4 and perpendicular to the transporting direction T along the transporting path section 20. As already mentioned the first portion(s) 12 has/have a higher heat-conducting rate and/or a higher heat-generating rate than the second portion(s) 13.

The heating drum has a cavity 14 for receiving (hot) heating fluid via an inlet (right arrow in FIG. 4). Preferably, the drum has an outlet for discharging the heating fluid (left arrow in FIG. 4).

The first portions 12 and the second portions 13 form the supporting surface 16. In an alternative embodiment they may extend close to the supporting surface 16 of the heating means 4, thus themselves not forming the supporting surface 16.

Preferably, the first portion(s) 12 is/are formed from electrically conducting material and the second portion(s) 13 is/are formed from electrically insulating material.

The fabrication apparatus 1 of FIG. 1 further comprises at least one induction element 10, particularly a coil, winding(s) or loop(s), wherein the first portion(s) 12 of the heating means 4 is/are arranged in the effective range of the at least one induction element 10. In FIG. 1 the transporting path section 20 of the sheet 6, 7 extends between the induction element 10 and the supporting surface 16 of the heating means 4.

The apparatus 1 also comprises a means 5 for pressing the conductor array 17 and the sheet 6, 7 against the supporting surface 16 of the heating means 4. In the present embodiment the means 5 for pressing is formed by a circulating belt. Alternatively, the sheet 6 may be pressed against a heating means 4 by a tensioning means for tensioning the conductor array 17 thus.

In the preferred case of a heating drum, the first portion(s) 12 and the second portion(s) 13 alternate with each other in a direction parallel to the rotational axis R of the drum. Preferably, the first portion(s) 12 and/or second portion(s) 13 of the structure are essentially rotational-symmetric with respect to the axis R of the drum. It is also preferred that the cylindrical surface of the drum is smooth (i.e. has no steps) along the structure of the first and second portions.

In the following the preferred embodiment of the figures is described in more detail: FIG. 1 shows an embodiment of the apparatus 1 according to the present invention. Multiple parallel conductors 2 (coming from supply spool(s) that are not shown, only one conductors 2 visible) run around a deviation roller 3, a heating drum 4 and pressing means 5, here a pressing belt. The conductors 2 are here shown to have a certain distance from the deviation roller, heating drum and pressing belt, respectively, but this is only done for clarity. Normally, portions of the conductors and/or the sheet to be applied thereto would be pressed against the deviation roller 3, heating drum or pressing belt in different stages of the process.

The conductors 2 could also be a mesh of grid. The latter may be formed by intertwining wires or by other means such as known from U.S. Pat. No. 8,569,096 B1. Here the invention will be described in relation to wires, but all applies to meshes and grids as well.

When manufacturing interconnector assemblies, the conductors 2 are initially moved as indicated by arrow M; deviation roller 3, heating drum 4 and pressing belt 5 rotating accordingly. Deviation roller 3 may also function as tensioning means for the conductors 2.

A first sheet 6 (preferably a foil) comprises a carrier layer forming side 6a and a coating forming the side 6b of the sheet 6. The first sheet 6 is inserted between the conductor array 17 and the heating drum 4 near insertion point P1. Means for supplying the sheet 6 are not shown in detail. The carrier layer may e.g. be made of PET having a melting temperature of about 82° C. and the coating is made of PE (Polyethilen) and EVA (EthylineVinilenayetat) having a melting temperature between 30 and 80° C. depending on the ratio of both components. Alternatively, the sheet may consist of one layer of material only. In that case 6a would be the free surface of the sheet and 6b the contacting surface.

As first sheet 6 is moved along with heating drum 4, its temperature is increased but the temperature is kept below the melting temperature of the carrier layer forming side 6a of the sheet so that the sheet does not stick to the heating drum 4. Now there are two alternatives.

If the sheet 6 has a coating (forming side 6b) that has a lower melting temperature than the carrier layer (forming side 6a), the sheet 6 may be heated to a temperature above the melting temperature of the coating, wherein the temperature remains below the melting temperature of the carrier layer (forming side 6a). In this way the sheet 6 still does not adhere to the heating drum 4, while the coating becomes soft enough to stick to the conductors 2.

If there is no coating provided or the coating does not have a melting temperature that is low enough to be softened while the carrier layer remains hard enough, the conductors 2 may be heated. This may e.g. also be the case if no coating is applied (6b indicating the contacting surface).

The conductors 2 may be heated by heating means (here in form of an induction element 10) that does not heat the sheet 6, such as an induction coil or electromagnetic radiation (that is not absorbed as much by the sheet). In this way the coating or contacting surface (forming side 6b) is heated additionally via the conductors 2, passing its melting temperature and adhering to the conductors 2 while the carrier layer or free surface of the sheet 6 remains below its melting temperature and therefore does not stick to the heating drum 4.

The tension in the conductors 2 together with the geometry of the heating drum 4 presses the conductors 2 against sheet 6 so that they stick to each other once the coating or contacting surface (forming side 6b) passes the melting temperature. After sheet 6 passes point P3 it leaves the heating zone, cools down and the sheet 6 has been applied, i.e. bonded, to the conductors.

Near insertion point P2 (FIG. 1) a second, in this case identical sheet 7 comprising a carrier layer (forming side 7a) and a coating (forming side 7b) is inserted between the conductors 2 and the pressing belt 5. The second sheet 7 is transported along with the conductors 2 and the heating drum 4. Now the conductors 2 are pressed against heating drum 4 and not as much the sheet 7. Since the distance that second sheet 7 travels (abuttingly) along the heating drum 4 is shorter than is the case for the first sheet 6 and the heat transfer is impaired by the distance or at least reduced pressure between the heating drum 4 and the second sheet 7, heating means, here an induction element 10 may be provided in order to heat side 7b of the second sheet 7 above its melting temperature. In addition, the heating means may introduce more energy into the conductors 2 and thus into contact zones 8 when a second sheet 7 passes as compared to when a first sheet 6 passes.

Whereas the coating/contacting side 6b of the first sheet 6 faces away from the heating drum 4, thus preventing the coating/contacting side 6b from sticking to anything but the conductors 2 when softened, the coating/contacting side 7b of the second sheet 7 faces towards the heating drum 4 and is even pressed towards it by pressing means 5.

According to the invention the sheet does not stick to heating drum 4 due to only locally heating the coating/contacting side 7b of second sheet 7 to a temperature higher than its melting temperature. In addition, intermediate portions 9 (see FIG. 2) of the coating/contacting side 7b that do not touch the conductors 2 are kept at a distance from heating drum 4 or at least the pressure forcing these intermediate portions 9 towards heating drum 4 is significantly lower that the pressure pushing the second sheet 7 against the conductors 2. This will be explained in detail with reference to FIG. 2.

As second sheet 7 travels along with conductors 2 and heating drum 4, the temperature of coating/contacting side 7b is raised above its melting temperature and the conductors 2 will stick to it.

If the heating of the sheet(s) 6, 7 depends on heating means 10, the conductors 2 and sheet 6, 7 will, at least locally, start cooling down right after the sheet has past the heating means 10. The wires may therefore already stick to be held by the sheet 6, 7 before passing point P3.

FIG. 2 shows a sheet 6, 7 covered by conductors 2 as if looking in the direction of arrow V in FIG. 1. As can be seen, the conductors 2 are on top (touching the heating drum 4 that is not shown here) of sheet 7. Since heating drum 4 has a higher temperature than the conductors 2 and sheet 6, 7, heat will flow from the heating drum 4 to the conductors 2 and (indirectly) to the sheet 6, 7.

For the second sheet 7, the conductors 2 are in direct contact with the heating drum 4 and heat can flow more readily to the conductors 2 than to the coating or contacting side 7b of the second foil 7 that is at a (small) distance from the heating drum 4 or at least is not pressed against it (pressing means must not adopt to the irregular shape of the conductors). This leads to the contact zones 8 (not visible in FIG. 2) of the sheet 7 covered by conductors 2 and portions 8' directly adjacent heating up more quickly than the central area of intermediate portions 9, the latter thus being kept cool and ideally cool enough not to stick to heating drum 4.

In order to delimit the heat transfer from the heating drum to intermediate portions 9 of the sheet not covered by wires even further, heating drum 4 has first portions 12 made of a material with a low thermal resistance, such as a metal, and second portions 13 with high thermal resistance, such as a plastic material, as is shown in FIG. 3. The conductors 2 extend adjacent the first portions 12 with low thermal resistance while the sheet extends (also) over the second portions 13 with high thermal resistance. In this way, keeping the inside (here: cavity 14 filled with heating fluid; see FIG. 4) of heating drum 4 at a given temperature, will result in contact zones 8 of the sheet covered by conductors 2 getting heated more than intermediate portions 9 not covered by conductors 2, since the thermal resistivity between the inside of heating drum 4 and contact zones 8 (to be covered by conductors 2) is lower than the thermal resistivity between the inside of heating drum 4 and intermediate portions 9 (not covered by conductors 2).

An additional measure to delimit the heat transfer to intermediate portions 9 is to heat (only) the wires by an (additional) heating means 10 that does not heat the sheet, such as an induction coil or electromagnetic radiation (that is not absorbed as much by the sheet).

It is preferred, that if a structured heating drum is used, the first portions 12 of the heating drum touching the conductors 2 are typically made of metal (at least near the surface) and second portions 13 not touching the conductors 2 are typically not made of metal, thus allowing to selectively heat the surface of the heating drum 4 by means of an induction coil.

In order to further selectively promote heat transfer from the inside of heating drum 4 to conductors 2, the heating drum may be build up as shown in FIG. 4 where a cross-sectional view of an embodiment of a heating drum 4 is given. The inside of heating drum 4 is shown to be hollow and forming a cavity 14 and may e.g. contain a fluid of a certain temperature. Ribs 15 extend into the cavity and thus reduce the thermal resistance between the conductors 2 and the inside of heating drum 4. Conductors 2 touching on first portions 12 with low thermal resistance and thus contacting zones 8 of the foil 7 covered by those conductors 2 and portions 8' directly adjacent thereto will consequently be heated more readily. Intermediate Portions 9, particularly the central area of that portions 9, not covered by conductors 2 overlap with second portions 13 of heating drum 4 with high thermal resistance and therefore will not be heated as much.

In practice the heating means 4 may be formed from of a number of rings held together by bolds, the rings thus forming a drum-like structure. In this way rings forming first portions 12 and ribs 15 may alternate with rings forming second portions 13. It is easier to make such rings and then join them than to make a complete heating drum.

The invention is not restricted to these embodiments. Other variants will be obvious for the person skilled in the art and are considered to lie within the scope of the invention as formulated in the following claims. Individual features described in above specification, particularly with respect to the figures may be combined with each other to form other embodiments and/or applied mutatis mutandis to what is described in the claims and to the rest of the description.

LIST OF REFERENCE SIGNS

1 Apparatus for fabricating an interconnector assembly
2 Electrical conductor
3 Deviation roller
4 Heating means
5 Means for pressing
6 First sheet
6a, 6b Sides of the first sheet
7 Second sheet
7a, 7b Sides of the second sheet
8 Contact zone
8' portion directly adjacent to the contact zone
9 Intermediate portion
10 Induction element
11 Interconnector assembly
12 First portion of the heating means
13 Second portion of the heating means
14 Cavity
15 Rib
16 Supporting surface
17 Conductor array
18 Interspaces
19 Transporting path
20 Transporting path section
21 Solar cell
T Transporting direction along the supporting surface 16
M Initial direction of movement of the conductors 2
P1, P2 Insertion points
P3 End of heating zone
R Rotational axis of heating drum
V Direction of looking in FIG. 3

What is claimed is:

1. A method for making an interconnector assembly (11) for electrically interconnecting solar cells (21), wherein the method comprises:
   providing a plurality of electrical conductors (2) that form a conductor array (17) having defined interspaces (18) that are free from said electrical conductors (2),
   feeding said plurality of electrical conductors through one or more rollers, each of said one or more rollers comprising at least two distinct portions, and
   applying at least one sheet (6, 7), said sheet being made of electrically insulating material, to a first side of the conductor array (17), wherein the at least one sheet (6, 7) has at least one contact zone (8) contacting the electrical conductors (2) and intermediate portions (9) overlapping the defined interspaces (18) of the conductor array (17),
   wherein the step of applying the at least one sheet (6, 7) to a side of the conductor array (17) comprises:
   before the conductors (2) come into in contact with the sheet (6, 7) and/or when the conductors (2) are in contact with the sheet (6, 7): increasing the temperature in the at least one contact zone (8) of the sheet (6, 7) to a first temperature, wherein the first temperature is above the temperature at which a material forming that at least one contact zone (8) becomes sticky, such that the electrical conductors (2) are bonded to the sheet (6, 7) by the material of the at least one contact zone,
   wherein a side (6 a, 7 a) of the at least one sheet (6, 7) that faces away from the conductor array (17) is kept at a second temperature, wherein the second temperature is below the temperature at which a material forming the side (6a, 7 a) of the sheet (6, 7) that faces away from the conductor array (17) becomes sticky,
   wherein the intermediate portions (9) of the at least one sheet (6, 7) are kept at least partially at a second temperature, wherein the second temperature is below the temperature at which a material forming the intermediate portions (9) becomes sticky.

2. The method according to claim 1, wherein the first temperature is the melting temperature or the lowest temperature of the melting range of the material forming that contact zone (8) and/or wherein the difference between the first temperature and the second temperature amounts to at least 10° C.

3. The method according to claim 1, wherein the step of applying the at least one sheet (6, 7) to a side of the conductor array (17) comprises: guiding the conductor array (17) and the at least one sheet (6, 7) in an overlapping manner by means of a supporting surface (16) of a heating means (4) in a transporting direction (T).

4. The method according to claim 3, wherein the heating means (4) is formed by a rotatable heating drum, wherein a cylindrical surface of the drum coming into contact with the sheet (6, 7) is smooth.

5. The method according to claim 4, wherein the heating drum has a supporting surface (16) for receiving a plurality of electrical conductors (2) that form a conductor array (17) and/or a sheet (6, 7), wherein the heating drum has a structure of at least one first portion (12) and at least one second portion (13), wherein the at least one first portion and the at least one second portion alternate with each other in a direction parallel to the axis (R) of the drum and wherein the at least one first portion (12) has a higher heat-conducting rate and/or a higher heat-generating rate than the at least one second portion (13).

6. The method according to claim 3, wherein the heating means (4) has a structure of a plurality of first and second portions (12, 13), wherein the first portion(s) and the second portion(s) alternate with each other in a direction that is parallel to the supporting surface (16) of the heating means (4) and perpendicular to the transporting direction (T) of the conductor array (17) and/or the sheet (6, 7) and wherein the first portion(s) (12) has/have a higher heat-conducting rate and/or a higher heat-generating rate than the second portion(s) (13).

7. The method according to claim 3, wherein the heating means (4) and/or the conductor array (17) is heated by means of an inductive element (10), particularly a coil, winding(s), or loop(s).

8. The method according to claim 3, wherein a sheet (6, 7) abuts against the supporting surface (16) of the heating means (4) with its side (6 a, 7 a) that faces away from the conductor array (17).

9. The method according to claim 1, wherein the melting temperature or the lowest temperature of the melting range of the material of the contact zone(s) (8) of the sheet (6, 7) is lower than the melting temperature or the lowest temperature of the melting range of the material forming the side (6 a, 7 a) of the sheet (6, 7) that faces away from the conductor array (17).

10. The method according to claim 3, wherein the conductor array (17) and the at least one sheet (6, 7) overlapping with each other are heated only from the side of the conductor array (17).

11. An apparatus (1) for fabricating an interconnector assembly (11) for electrically interconnecting solar cells (19), comprising:
   means for bringing together a plurality of electrical conductors (2) that form a conductor array (17) and a sheet (6, 7), made of electrically insulating material,
   heating means (4) adapted for inducing a non-uniform heat distribution within the sheet (6, 7), wherein the heating means (4) is moveable, and
   a transporting path (19) for transporting the conductor array (17) and/or the sheet (6, 7), wherein the transporting path (19) at least partially extends along the heating means (4), the transporting path comprising at least one roller and at least one circulating belt.

12. The apparatus according to claim 11, wherein the heating means (4) has a supporting surface (16) for receiving the conductor array (17) and/or the sheet (6, 7) and defining a transporting path section (20) that extends along the supporting surface (16) of the heating means (4), wherein the heating means (4) has a structure of a plurality of first and second portions (12, 13), wherein the first portion(s) and the second portion(s) alternate with each other in a direction that is parallel to the supporting surface (16) of the heating means (4) and perpendicular to the transporting direction (T) along the transporting path section (20) and wherein the first portion(s) (12) have a higher heat-conducting rate and/or a higher heat-generating rate than the second portion(s) (13).

13. The apparatus according to claim 11, wherein the heating means (4) is formed by a rotatable drum, wherein the drum comprises one or more chambers and one or more inlets for a heating fluid which is provided to the one or more chambers of the rotatable drum.

14. The apparatus according to claim 12, wherein the first portion(s) (12) and the second portion(s) (13) form the supporting surface (16) or extend close to the supporting surface (16) of the heating means (4).

15. The apparatus according to claim 11, wherein the first portion(s) (12) is/are formed from electrically conducting material and the second portion(s) (13) is/are formed from electrically insulating material.

16. The apparatus according to claim 11, wherein the apparatus (1) comprises at least one induction element (10), particularly a coil, winding(s) or loop(s), and wherein the first portion(s) (12) is/are arranged in the effective range of the at least one induction element (10), wherein the transporting path section (20) extends between the induction element (10) and the supporting surface (16) of the heating means (4).

17. The apparatus according to claim 16, wherein the first portion(s) is/are formed from paramagnetic high-grade steel, and wherein the second portion(s) is/are formed from non-magnetic material and/or electrically insulating material.

18. The apparatus according to claim 11, wherein the apparatus (1) comprises a means (5) for pressing the conductor array (17) and the sheet (6, 7) against the supporting surface (16) of the heating means (4), wherein the means (5) for pressing is formed by a circulating belt and/or by a tensioning means for tensioning the conductor array (17).

19. The apparatus according to claim 18, wherein the means (5) for pressing is transparent to infrared radiation, and wherein a process temperature of the sheet and/or the conductors and/or the heating means, is monitored by means of a pyrometer.

20. A heating drum, for making an interconnector assembly for electrically interconnecting solar cells, for applying at least one sheet to a side of a conductor array, the heating drum comprising:
a supporting surface (16) for receiving a plurality of electrical conductors (2) that form a conductor array (17) and/or a sheet (6, 7),
wherein the heating drum has a structure of at least one first portion (12) and at least one second portion (13),
a plurality of first and second portions (12, 13), wherein the first portion(s) and the second portion(s) alternate with each other in a direction parallel to the axis (R) of the drum and wherein the first portion(s) (12) has/have a higher heat-conducting rate and/or a higher heat-generating rate than the second portion(s) (13).

* * * * *